United States Patent
Katayama et al.

(10) Patent No.: US 10,737,965 B2
(45) Date of Patent: Aug. 11, 2020

(54) METHOD OF MANUFACTURING GLASS SHEET

(71) Applicant: Nippon Electric Glass Co., Ltd., Shiga (JP)

(72) Inventors: Hiroki Katayama, Shiga (JP); Hiroshi Nakajima, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 61 days.

(21) Appl. No.: 15/641,656

(22) Filed: Jul. 5, 2017

(65) Prior Publication Data

US 2017/0297946 A1 Oct. 19, 2017

Related U.S. Application Data

(63) Continuation-in-part of application No. PCT/JP2015/085678, filed on Dec. 21, 2015.

(30) Foreign Application Priority Data

Jan. 5, 2015 (JP) .................................. 2015-000276

(51) Int. Cl.
   *C03B 29/02* (2006.01)
   *C03B 17/06* (2006.01)
   (Continued)

(52) U.S. Cl.
   CPC ............ *C03B 29/02* (2013.01); *C03B 17/064* (2013.01); *C03B 29/025* (2013.01);
   (Continued)

(58) Field of Classification Search
   CPC ... C03B 17/064; C03B 33/091; C03B 33/082; C03B 29/00–29/16; C03C 23/0025; C03C 19/00
   See application file for complete search history.

(56) References Cited

U.S. PATENT DOCUMENTS 8,394,515 B2 * 3/2013 Yagi ........................ C03C 3/097
                                                              360/135
8,656,734 B2 * 2/2014 Zou ........................ C03B 11/088
                                                              65/122
(Continued)

FOREIGN PATENT DOCUMENTS

CN        101646524      2/2010
JP        2002-150546    5/2002
(Continued)

OTHER PUBLICATIONS

Chinese Office Action dated Apr. 17, 2019 in corresponding Chinese Patent Application No. 201580068545.9 with English translation of Search Report.

(Continued)

*Primary Examiner* — Erin Snelting

(74) *Attorney, Agent, or Firm* — Wenderoth, Lind & Ponack, L.L.P.

(57) ABSTRACT

A technical object of the present invention is to devise a glass sheet that is suitable for supporting a substrate to be processed to be subjected to high-density wiring and has high end surface strength, and a method of manufacturing the glass sheet, to thereby contribute to an increase in density of a semiconductor package. The glass sheet of the present invention has a total thickness variation of less than 2.0 μm, all or part of an end surface of the glass sheet including a melt-solidified surface.

6 Claims, 4 Drawing Sheets

(2 of 4 Drawing Sheet(s) Filed in Color)

(51) Int. Cl.
*C03B 33/00* (2006.01)
*C03C 19/00* (2006.01)
*H01L 23/00* (2006.01)
*C03C 3/087* (2006.01)
*C03C 3/093* (2006.01)
*C03C 3/091* (2006.01)
*C03C 23/00* (2006.01)
*C03B 33/09* (2006.01)
*H01L 21/683* (2006.01)
*H01L 21/56* (2006.01)

(52) U.S. Cl.
CPC ............ *C03B 33/091* (2013.01); *C03C 3/087* (2013.01); *C03C 3/091* (2013.01); *C03C 3/093* (2013.01); *C03C 19/00* (2013.01); *C03C 23/0025* (2013.01); *H01L 21/6835* (2013.01); *H01L 24/00* (2013.01); *H01L 24/96* (2013.01); *H01L 24/97* (2013.01); *H01L 21/565* (2013.01); *H01L 21/568* (2013.01); *H01L 24/11* (2013.01); *H01L 2221/68327* (2013.01); *H01L 2221/68359* (2013.01); *H01L 2224/11002* (2013.01); *H01L 2224/12105* (2013.01); *H01L 2924/3511* (2013.01)

(56) References Cited

U.S. PATENT DOCUMENTS

| | | |
|---|---|---|
| 2002/0108400 A1 | 8/2002 | Watanabe et al. |
| 2003/0180731 A1* | 9/2003 | Worrall, III ........... C03B 33/093 435/6.16 |
| 2008/0202167 A1 | 8/2008 | Cavallaro et al. |
| 2011/0187002 A1* | 8/2011 | Kishii ..................... H01L 24/18 257/773 |
| 2014/0137602 A1 | 5/2014 | Tamamura et al. |

FOREIGN PATENT DOCUMENTS

| | | |
|---|---|---|
| JP | 2011-16705 | 1/2011 |
| JP | 2012-238894 | 12/2012 |
| WO | 2013/099676 | 7/2013 |
| WO | 2015/037478 | 3/2015 |
| WO | 2015/156075 | 10/2015 |

OTHER PUBLICATIONS

International Search Report dated Mar. 8, 2016 in International (PCT) Application No. PCT/JP2015/085678.

* cited by examiner

METHOD OF MANUFACTURING GLASS SHEET

TECHNICAL FIELD

The present invention relates to a glass sheet and a method of manufacturing the glass sheet, and more specifically, to a glass sheet to be used for supporting a substrate to be processed in a manufacturing process for a semiconductor package, and a method of manufacturing the glass sheet.

BACKGROUND ART

Portable electronic devices, such as a cellular phone, a notebook-size personal computer, and a personal data assistance (PDA), are required to be downsized and reduced in weight. Along with this, a mounting space for semiconductor chips to be used in those electronic devices is strictly limited, and there is a problem of high-density mounting of the semiconductor chips. In view of this, in recent years, there has been an attempt to perform high-density mounting of a semiconductor package by a three-dimensional mounting technology, that is, by laminating semiconductor chips on top of another and connecting the semiconductor chips through wiring.

In addition, a conventional wafer level package (WLP) is manufactured by forming bumps into a wafer shape and dicing the wafer into chips. However, the conventional WLP has problems in that it is difficult to increase the number of pins, and chipping and the like of semiconductor chips are liable to occur because the semiconductor chips are mounted in a state in which the back surfaces thereof are exposed.

Therefore, as a new WLP, a fan-out type WLP has been proposed. In the fan-out type WLP, it is possible to increase the number of pins, and chipping and the like of semiconductor chips can be prevented by protecting end portions of the semiconductor chips.

SUMMARY OF INVENTION

Technical Problem

The manufacturing method of the fan-out type WLP includes the step of molding a plurality of semiconductor chips with a sealing material of a resin, to thereby form a substrate to be processed, followed by arranging wiring on one surface of the substrate to be processed, the step of forming solder bumps, and the like.

Those steps involve heat treatment at about 200° C. to about 300° C., and hence there is a risk in that the sealing material may be deformed, and the substrate to be processed may change in dimension. When the substrate to be processed changes in dimension, it becomes difficult to arrange wiring at high density on one surface of the substrate to be processed, and it is also difficult to form the solder bumps accurately.

In order to suppress a change in dimension of a substrate to be processed, it is effective to use a glass sheet as a supporting plate. The glass sheet is smoothened easily on the surface thereof and has stiffness. Accordingly, when the glass sheet is used, the substrate to be processed can be supported strongly and accurately. In addition, the glass sheet easily transmits light, for example, UV light. Accordingly, when the glass sheet is used, the substrate to be processed and the glass sheet can be easily fixed onto each other through formation of an adhesive layer or the like. In addition, the substrate to be processed and the glass sheet can also be easily separated from each other through formation of a peeling layer or the like.

However, even when the glass sheet is used, it has been difficult to subject one of the surfaces of the substrate to be processed to high-density wiring in some cases.

Further, it is required that the glass sheet configured to support the substrate to be processed be less liable to be broken during loading/unloading, conveyance, or processing. The mechanical strength of the glass sheet depends on the ratio of chipping, microcracking, and the like of an end surface, and the mechanical strength of the glass sheet decreases significantly depending on the ratio. When a chamfered portion is formed on the end surface of the glass sheet by polishing, chipping and the like can be reduced, but it is difficult to completely remove microcracks. As a result, the end surface strength of the glass sheet cannot be increased sufficiently, and the glass sheet is liable to be broken during loading/unloading, conveyance, or processing.

The present invention has been made in view of the above-mentioned circumstances, and a technical object of the present invention is to devise a glass sheet that is suitable for supporting a substrate to be processed to be subjected to high-density wiring and has high end surface strength, and a method of manufacturing the glass sheet, to thereby contribute to an increase in density of a semiconductor package.

Solution to Problem

The inventors of the present invention have repeatedly carried out various experiments. As a result, the inventors of the present invention have found that the above-mentioned technical object can be achieved by reducing the total thickness variation and further forming a melt-solidified surface on the end surface of the glass sheet. Thus, the inventors of the present invention have proposed this finding as the present invention. That is, firstly, a glass sheet according to one embodiment of the present invention has a total thickness variation of less than 2.0 μm, and all or part of an end surface of the glass sheet comprises a melt-solidified surface. The "total thickness variation" as used herein refers to a difference between the maximum thickness and the minimum thickness of the entire glass sheet, and may be measured with, for example, SBW-331ML/d manufactured by Kobelco Research Institute, Inc.

The glass sheet according to the embodiment of the present invention has a total thickness variation of less than 2.0 μm. When the total thickness variation is decreased to less than 2.0 μm, the accuracy of processing treatment can be easily enhanced. In particular, wiring accuracy can be enhanced, and hence high-density wiring can be performed. In addition, the in-plane strength of the glass sheet is improved, and hence the glass sheet and the laminate are less liable to be broken. Further, the number of times of reuse (number of endurable uses) of the glass sheet can be increased.

In the glass sheet according to the embodiment of the present invention, all or part of the end surface comprises a melt-solidified surface. With this, microcracks present on the end surface are melted to be eliminated, and the end surface is brought into a smooth state. Therefore, the end surface strength of the glass sheet can be significantly increased.

FIG. 1 is a photograph of a cross-section for showing a state in which an end surface of a glass sheet is melt-solidified by laser irradiation. As is understood from FIG. 1, the end surface of the glass sheet is a smooth mirror surface and is also in a spherical liquid reservoir state, that is, in a state of expanding in a spherical shape. FIG. 2 is a photograph of a cross-section for showing a state in which the expanding portion of the glass sheet shown in FIG. 1 is removed by polishing to reduce the total thickness variation to less than 2.0 µm.

Secondly, it is preferred that the glass sheet according to the embodiment of the present invention have a total thickness variation of less than 1.0 µm.

Thirdly, it is preferred that in the glass sheet according to the embodiment of the present invention, the melt-solidified surface be formed by laser irradiation. With this, a melt-solidified region of the end surface can be easily regulated. Further, the expanding state of the melt-solidified surface can be easily regulated.

Fourthly, it is preferred that the glass sheet according to the embodiment of the present invention have a warpage level of 60 µm or less. The "warpage level" as used herein refers to the total of the absolute value of the maximum distance between the highest point and the least squares focal plane of the entire glass sheet, and the absolute value of the maximum distance between the lowest point and the least squares focal plane thereof, and may be measured with, for example, SBW-331ML/d manufactured by Kobelco Research Institute, Inc.

Fifthly, it is preferred that all or part of a surface of the glass sheet according to the embodiment of the present invention comprise a polished surface.

Sixthly, it is preferred that the glass sheet according to the embodiment of the present invention be formed by an overflow down-draw method.

Seventhly, it is preferred that the glass sheet according to the embodiment of the present invention have a Young's modulus of 65 GPa or more. The term "Young's modulus" as used herein refers to a value obtained by measurement using a bending resonance method. 1 GPa is equivalent to about 101.9 Kgf/mm$^2$.

Eighthly, it is preferred that the glass sheet according to the embodiment of the present invention have a contour of a wafer shape.

Ninthly, it is preferred that the glass sheet according to the embodiment of the present invention be used for supporting a substrate to be processed in a manufacturing process for a semiconductor package.

Tenthly, it is preferred that a laminate according to one embodiment of the present invention comprise a laminate including at least a substrate to be processed and a glass sheet configured to support the substrate to be processed, the glass sheet comprising the above-mentioned glass sheet.

Eleventhly, a method of manufacturing a glass sheet according to one embodiment of the present invention comprises the steps of : (1) cutting a mother glass sheet to provide a glass sheet; (2) melting part or all of an end surface of the glass sheet by laser irradiation, followed by solidifying the part or the all of the end surface; and (3) polishing a surface of the glass sheet so that the glass sheet has a total thickness variation of less than 2.0 µm.

Twelfthly, it is preferred that the method of manufacturing a glass sheet according to the embodiment of the present invention further comprise forming the mother glass sheet by an overflow down-draw method.

BRIEF DESCRIPTION OF DRAWINGS

The patent or application file contains at least one drawing executed in color. Copies of this patent or patent application publication with color drawing(s) will be provided by the Office upon request and payment of the necessary fee.

DESCRIPTION OF EMBODIMENTS

Figure 1:
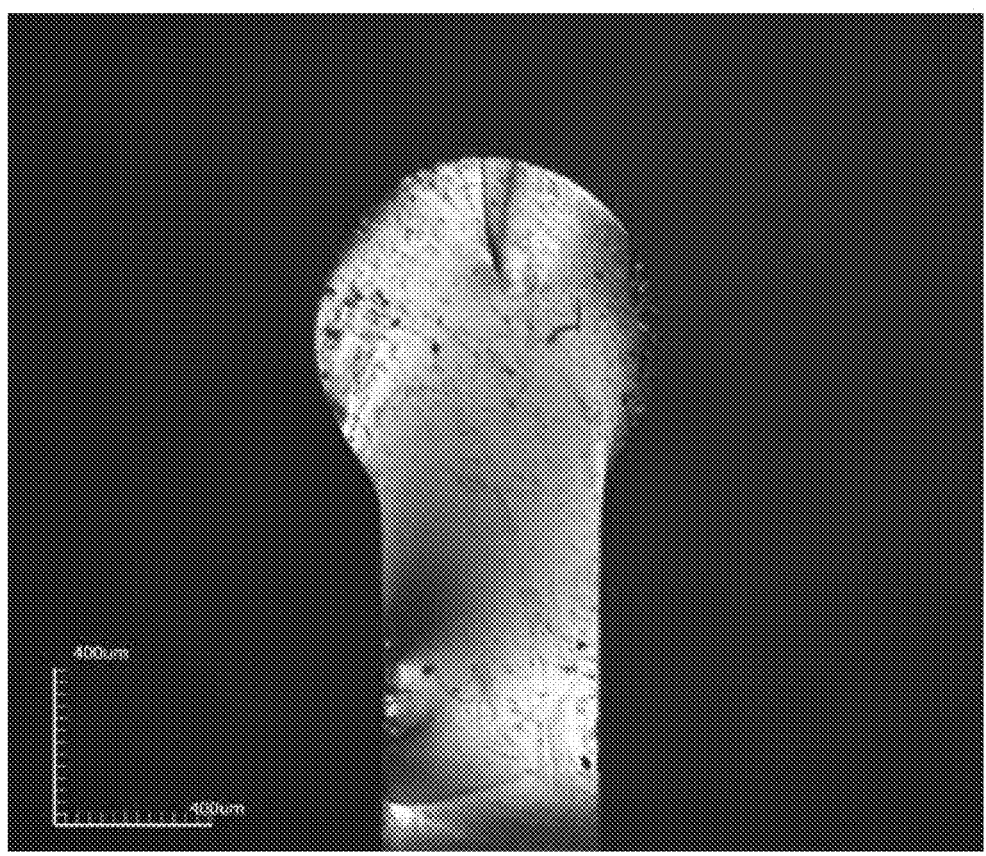
FIG. 1 is a photograph of a cross-section for showing a state in which an end surface of a glass sheet is melt-solidified by laser irradiation.
Figure 2:
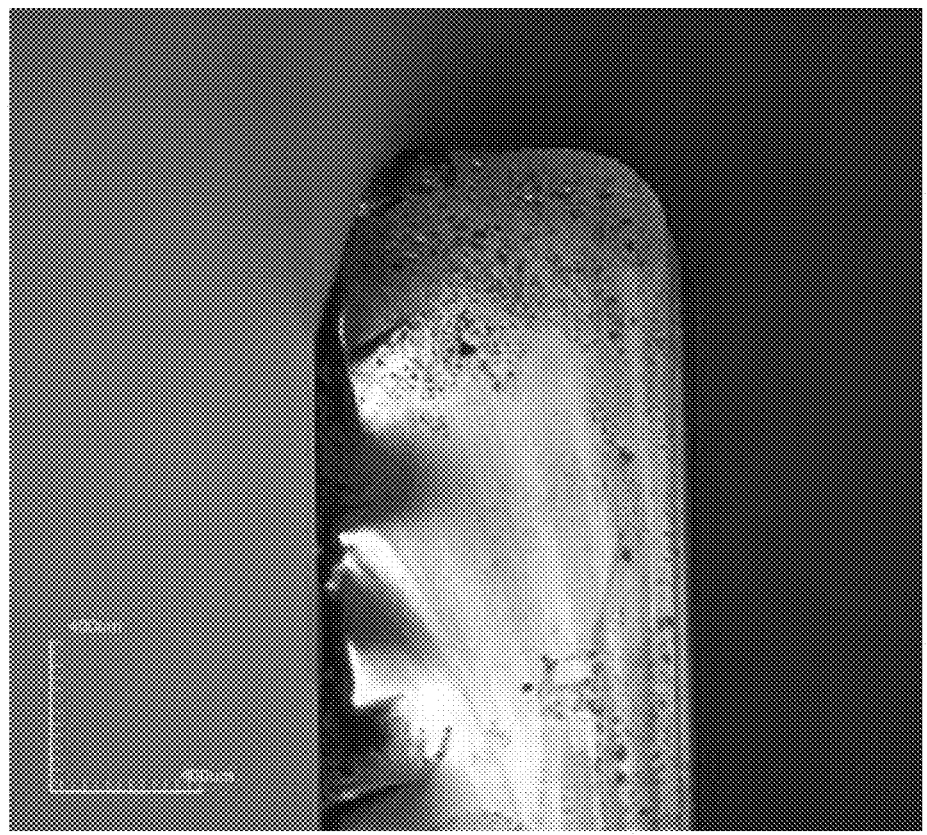
FIG. 2 is a photograph of a cross-section for showing a state in which an expanding portion of the glass sheet shown in FIG. 1 is removed by polishing to reduce a total thickness variation to less than 2.0 µm.

A glass sheet of the present invention has a total thickness variation of preferably less than 2 µm, more preferably 1.5 µm or less, still more preferably 1 µm or less, yet still more preferably less than 1 µm, even yet still more preferably 0.8 µm or less, even yet still more preferably from 0.1 µm to 0.9 µm, particularly preferably from 0.2 µm to 0.7 µm. As the total thickness variation becomes smaller, the accuracy of processing treatment is easily increased. In particular, the wiring accuracy can be increased, and hence high-density wiring can be performed. Further, the strength of the glass sheet is increased, with the result that the glass sheet and a laminate are less liable to be broken. Further, the number of times of reuse (number of endurable uses) of the glass sheet can be increased.

All or part of an end surface of the glass sheet of the present invention comprises a melt-solidified surface, and in terms of an area ratio, the melt-solidified surface occupies preferably 70% or more of the end surface, more preferably 90% or more thereof, still more preferably the entire end surface. As the ratio of the melt-solidified surface in the end surface becomes higher, the end surface strength of the glass sheet can be increased.

As a method of forming the melt-solidified surface in the end surface, various methods may be adopted. For example, there are given a method of heating the end surface directly with a burner, a method of heating the end surface locally by laser irradiation, and the like. The latter method is preferred because, through regulation of the irradiation condition, a region to be melt-solidified is easily regulated, and the expanding state of the melt-solidified surface is easily regulated. Further, the melt-solidified surface can also be formed on the end surface of the glass sheet by subjecting the glass sheet to fusion cutting by laser irradiation. Various lasers may be used as a laser. For example, a $CO_2$ laser, a YAG laser, and the like may be used. In particular, the $CO_2$ laser having a wavelength of 10.6 µm is preferably used. This enables a laser beam to be accurately absorbed by the glass sheet.

It is preferred that the end surface have an R-shape (spherical shape) from the viewpoint of increasing the end surface strength. The end surface can be formed into such shape, for example, by forming a spherical expanding portion on the end surface by laser irradiation and removing the expanding portion that expands from a surface by polishing treatment.

The warpage level is preferably 60 μm or less, more preferably 55 μm or less, still more preferably 50 μm or less, yet still more preferably from 1 μm to 45 μm, particularly preferably from 5 μm to 40 μm. As the warpage level becomes smaller, the accuracy of processing treatment is easily increased. In particular, the wiring accuracy can be increased, and hence high-density wiring can be performed. Further, the number of times of reuse (number of endurable uses) of the glass sheet can be increased.

The arithmetic average roughness Ra of the surface is preferably 10 nm or less, 5 nm or less, 2 nm or less, or 1 nm or less, particularly preferably 0.5 nm or less. As the arithmetic average roughness Ra of the surface becomes smaller, the accuracy of the processing treatment can be enhanced easily. In particular, the wiring accuracy can be enhanced, and hence high-density wiring can be performed. The strength of the glass sheet is improved, and hence the glass sheet and the laminate are less liable to be broken. Further, the number of times of reuse (number of times of support) of the glass sheet can be increased. The "arithmetic average roughness Ra" may be measured with an atomic force microscope (AFM).

It is preferred that all or part of a surface of the glass sheet of the present invention be a polished surface. In terms of an area ratio, it is more preferred that 50% or more of the surface be a polished surface, it is still more preferred that 70% or more of the surface be a polished surface, and it is particularly preferred that 90% or more of the surface be a polished surface. With this, the total thickness variation can be easily reduced, and the warpage level can also be easily reduced.

As a method for the polishing treatment, various methods may be adopted. However, a method involving sandwiching both surfaces of a glass sheet with a pair of polishing pads and subjecting the glass sheet to polishing treatment while rotating the glass sheet and the pair of polishing pads together is preferred. Further, it is preferred that the pair of polishing pads have different outer diameters, and it is preferred that the polishing treatment be performed so that part of the glass sheet intermittently extends off the polishing pads during polishing. With this, the total thickness variation can be easily reduced, and the warpage level can also be easily reduced. In the polishing treatment, a polishing depth is not particularly limited, but the polishing depth is preferably 50 μm or less, 30 μm or less, or 20 μm or less, particularly preferably 10 μm or less. As the polishing depth becomes smaller, the productivity of the glass sheet is improved.

The glass sheet of the present invention preferably has a wafer shape (substantially perfectly circular shape), and the diameter thereof is preferably 100 mm or more and 500 mm or less, particularly preferably 150 mm or more and 450 mm or less. With this, the glass sheet is easily applied to the manufacturing process for a semiconductor package. As necessary, the glass sheet may be processed into the other shapes, for example, a rectangular shape.

In the glass sheet of the present invention, the thickness is preferably less than 2.0 mm, 1.5 mm or less, 1.2 mm or less, 1.1 mm or less, or 1.0 mm or less, particularly preferably 0.9 mm or less. As the thickness becomes smaller, the mass of the laminate is reduced, and hence a handling property is enhanced. Meanwhile, when the thickness is excessively small, the strength of the glass sheet itself decreases, and hence the glass sheet does not easily serve a function of a supporting plate. Thus, the thickness is preferably 0.1 mm or more, 0.2 mm or more, 0.3 mm or more, 0.4 mm or more, 0.5 mm or more, or 0.6 mm or more, particularly preferably more than 0.7 mm.

It is preferred that the glass sheet of the present invention have the following characteristics.

In the glass sheet of the present invention, it is preferred that the average thermal expansion coefficient within a temperature range of from 30° C. to 380° C. be $0\times10^{-7}$/° C. or more and $165\times10^{-7}$/° C. or less. With this, the thermal expansion coefficients of the substrate to be processed and the glass sheet are easily matched with each other. When the thermal expansion coefficients of the substrate to be processed and the glass sheet are matched with each other, a change in dimension (in particular, warping deformation) of the substrate to be processed during the processing treatment is suppressed easily. As a result, wiring can be arranged at high density on one surface of the substrate to be processed, and solder bumps can also be formed thereon accurately. The "average thermal expansion coefficient within a temperature range of from 30° C. to 380° C." may be measured with a dilatometer.

It is preferred that the average thermal expansion coefficient within a temperature range of from 30° C. to 380° C. be increased when the ratio of the semiconductor chips within the substrate to be processed is small and the ratio of the sealing material within the substrate to be processed is large. Meanwhile, it is preferred that the average thermal expansion coefficient be decreased when the ratio of the semiconductor chips within the substrate to be processed is large and the ratio of the sealing material within the substrate to be processed is small.

When the average thermal expansion coefficient within a temperature range of from 30° C. to 380° C. is set to $0\times10^{-7}$/° C. or more and less than $50\times10^{-7}$/° C., the glass sheet preferably comprises as a glass composition, in terms of mass %, 55% to 75% of $SiO_2$, 15% to 30% of $Al_2O_3$, 0.1% to 6% of $Li_2O$, 0% to 8% of $Na_2O+K_2O$, and 0% to 10% of $MgO+CaO+SrO+BaO$, or preferably comprises 55% to 75% of $SiO_2$, 10% to 30% of $Al_2O_3$, 0% to 0.3% of $Li_2O+Na_2O+K_2O$, and 5% to 20% of $MgO+CaO+SrO+BaO$. When the average thermal expansion coefficient within a temperature range of from 30° C. to 380° C. is set to $50\times10^{-7}$/° C. or more and less than $75\times10^{-7}$/° C., the glass sheet preferably comprises as a glass composition, in terms of mass %, 55% to 70% of $SiO_2$, 3% to 15% of $Al_2O_3$, 5% to 20% of $B_2O_3$, 0% to 5% of $MgO$, 0% to 10% of $CaO$, 0% to 5% of $SrO$, 0% to 5% of $BaO$, 0% to 5% of $ZnO$, 5% to 15% of $Na_2O$, and 0% to 10% of $K_2O$. When the average thermal expansion coefficient within a temperature range of from 30° C. to 380° C. is set to $75\times10^{-7}$/° C. or more and $85\times10^{7}$/° C. or less, the glass sheet preferably comprises as a glass composition, in terms of mass %, 60% to 75% of $SiO_2$, 5% to 15% of $Al_2O_3$, 5% to 20% of $B_2O_3$, 0% to 5% of $MgO$, 0% to 10% of $CaO$, 0% to 5% of $SrO$, 0% to 5% of $BaO$, 0% to 5% of $ZnO$, 7% to 16% of $Na_2O$, and 0% to 8% of $K_2O$. When the average thermal expansion coefficient within a temperature range of from 30° C. to 380° C. is set to more than $85\times10^{7}$/° C. and $120\times10^{7}$/° C. or less, the glass sheet preferably comprises as a glass composition, in terms of mass %, 55% to 70% of $SiO_2$, 3% to 13% of $Al_2O_3$, 2% to 8% of $B_2O_3$, 0% to 5% of $MgO$, 0% to 10% of $CaO$, 0% to 5% of $SrO$, 0% to 5% of $BaO$, 0% to 5% of $ZnO$, 10% to 21% of Na$_2$O, and 0% to 5% of K$_2$O. When the average thermal expansion coefficient within a temperature range of from 30° C. to 380° C. is set to more than 120×10$^{-7}$/° C. and 165×10$^{-7}$/° C. or less, the glass sheet preferably comprises as a glass composition, in terms of mass %, 53% to 65% of SiO$_2$, 3% to 13% of Al$_2$O$_3$, 0% to 5% of B$_2$O$_3$, 0.1% to 6% of MgO, 0% to 10% of CaO, 0% to 5% of SrO, 0% to 5% of BaO, 0% to 5% of ZnO, 20% to 40% of Na$_2$O+K$_2$O, 12% to 21% of Na$_2$O, and 7% to 21% of K$_2$O. With this, the thermal expansion coefficient is regulated easily within a desired range, and devitrification resistance is enhanced. Therefore, a glass sheet having a small total thickness variation is formed easily.

The Young's modulus is preferably 65 GPa or more, 67 GPa or more, 68 GPa or more, 69 GPa or more, 70 GPa or more, 71 GPa or more, or 72 GPa or more, particularly preferably 73 GPa or more. When the Young's modulus is excessively low, it becomes difficult to maintain the stiffness of the laminate, and the deformation, warpage, and breakage of the substrate to be processed are liable to occur.

The liquidus temperature is preferably less than 1,150° C., 1,120° C. or less, 1,100° C. or less, 1,080° C. or less, 1,050° C. or less, 1,010° C. or less, 980° C. or less, 960° C. or less, or 950° C. or less, particularly preferably 940° C. or less. With this, a glass sheet is formed easily by a down-draw method, in particular, an overflow down-draw method. Therefore, a glass sheet having a small thickness is manufactured easily, and the thickness variation after forming can be reduced. Further, in a manufacturing process for the glass sheet, a situation in which a devitrified crystal is generated to decrease the productivity of the glass sheet is prevented easily. The "liquidus temperature" may be calculated by loading glass powder that has passed through a standard 30-mesh sieve (500 μm) and remained on a 50-mesh sieve (300 μm) into a platinum boat, then keeping the glass powder for 24 hours in a gradient heating furnace, and measuring a temperature at which crystals of glass are deposited.

The viscosity at a liquidus temperature is preferably 10$^{4.6}$ dPa·s or more, 10$^{5.0}$ dPa·s or more, 10$^{5.2}$ dPa·s or more, 10$^{5.4}$ dPa·s or more, or 10$^{5.6}$ dPa·s or more, particularly preferably 10$^{5.8}$ dPa·s or more. With this, a glass sheet is formed easily by a down-draw method, in particular, an overflow down-draw method. Therefore, a glass sheet having a small thickness is manufactured easily, and the thickness variation after forming can be reduced. Further, in a manufacturing process for the glass sheet, a situation in which a devitrified crystal is generated to decrease the productivity of the glass sheet is prevented easily. The "viscosity at a liquidus temperature" may be measured by a platinum sphere pull up method. The viscosity at a liquidus temperature is an indicator of formability. As the viscosity at a liquidus temperature becomes higher, the formability is enhanced.

The temperature at 10$^{2.5}$ dPa·s is preferably 1,580° C. or less, 1,500° C. or less, 1,450° C. or less, 1,400° C. or less, or 1,350° C. or less, particularly preferably from 1,200° C. to 1,300° C. When the temperature at 10$^{2.5}$ dPa·s increases, meltability is degraded, and the manufacturing cost of a glass sheet rises. The "temperature at 10$^{2.5}$ dPa·s" may be measured by the platinum sphere pull up method. The temperature at 10$^{2.5}$ dPa·s corresponds to a melting temperature. As the melting temperature becomes lower, the meltability is enhanced.

The glass sheet of the present invention has a UV transmittance at a wavelength of 300 nm in a thickness direction of preferably 40% or more, more preferably 50% or more, still more preferably 60% or more, yet still more preferably 70% or more, particularly preferably 80% or more. When the UV transmittance is excessively low, it becomes difficult to bond the substrate to be processed and the glass sheet to each other through use of an adhesive layer by UV irradiation, and in addition, it becomes difficult to peel the glass sheet from the substrate to be processed through use of a peeling layer. The "UV transmittance at a wavelength of 300 nm in a thickness direction" may be evaluated, for example, by measuring a spectral transmittance at a wavelength of 300 nm through use of a double-beam type spectrophotometer.

The glass sheet of the present invention is preferably formed by a down-draw method, in particular, an overflow down-draw method. The overflow down-draw method refers to a method in which a molten glass is caused to overflow from both sides of a heat-resistant, trough-shaped structure, and the overflowing molten glasses are subjected to down-draw downward at the lower end of the trough-shaped structure while being joined, to thereby form a mother glass sheet. When a glass sheet is produced by the overflow down-draw method, surfaces that are to serve as the surfaces of the glass sheet are formed in a state of free surfaces without being brought into contact with the trough-shaped refractory. Therefore, a glass sheet having a small thickness is manufactured easily, and the total thickness variation can be reduced. As a result, the manufacturing cost of the glass sheet can be reduced.

As a method of forming a mother glass sheet, besides the overflow down-draw method, for example, a slot down method, a redraw method, a float method, a roll-out method, or the like may also be adopted.

It is preferred that the glass sheet of the present invention have a polished surface on a surface thereof and be formed by the overflow down-draw method. With this, the total thickness variation before the polishing treatment is reduced, and hence the total thickness variation can be reduced to the extent possible through the polishing treatment. The total thickness variation can be reduced to, for example, 1.0 μm or less.

From the viewpoint of reducing the warpage level, it is preferred that the glass sheet of the present invention be subjected to no chemical tempering treatment. Meanwhile, from the viewpoint of mechanical strength, it is preferred that the glass sheet be subjected to chemical tempering treatment. That is, from the viewpoint of reducing the warpage level, it is preferred that the glass sheet have no compressive stress layer in the surface thereof, and from the viewpoint of mechanical strength, it is preferred that the glass sheet have a compressive stress layer in the surface thereof.

The method of manufacturing a glass sheet of the present invention comprises the steps of: (1) cutting a mother glass sheet to provide a glass sheet; (2) melting part or all of an end surface of the glass sheet by laser irradiation, followed by solidifying the part or the all of the end surface; and (3) polishing a surface of the glass sheet so that the glass sheet has a total thickness variation of less than 2.0 μm. Here, the technical features (preferred configuration and effects) of the method of manufacturing a glass sheet of the present invention overlap the technical features of the glass sheet of the present invention. Thus, the details of the overlapping portions are omitted in this description.

The method of manufacturing a glass sheet of the present invention comprises the step of cutting a mother glass sheet to provide a glass sheet. As a method of cutting the mother glass sheet, various methods may be adopted. For example, a method of cutting a mother glass sheet through thermal shock during laser irradiation, and a method involving subjecting a mother glass sheet to scribing and cutting the resultant by bending are available.

The method of manufacturing a glass sheet of the present invention comprises the step of melting part or all of the end surface of the glass sheet by laser irradiation, followed by solidifying the part or the all of the end surface. A preferred mode of this step is as described above.

It is preferred that the method of manufacturing a glass sheet of the present invention comprise the step of annealing the glass sheet after forming a melt-solidified surface on the end surface of the glass sheet. From the viewpoint of reducing the residual stress of the end surface and the warpage level of the glass sheet, the annealing temperature is preferably equal to or more than the softening point of the glass sheet, and the retention time at the annealing temperature is preferably 30 minutes or more. The annealing may be performed in a heat treatment furnace, such as an electric furnace.

The method of manufacturing a glass sheet of the present invention further comprises the step of polishing the surface of the glass sheet so that the total thickness variation of the glass sheet is less than 2.0 µm, and a preferred mode of this step is as described above.

The laminate of the present invention has a feature of comprising at least a substrate to be processed and a glass sheet configured to support the substrate to be processed, the glass sheet comprising the above-mentioned glass sheet. Here, the technical features (preferred configuration and effects) of the laminate of the present invention overlap the technical features of the glass sheet of the present invention. Thus, the details of the overlapping portions are omitted in this description.

It is preferred that the laminate of the present invention comprise an adhesive layer between the substrate to be processed and the glass sheet. It is preferred that the adhesive layer be formed of a resin, and for example, a thermosetting resin, a photocurable resin (in particular, a UV-curable resin), and the like are preferred. It is preferred that the adhesive layer have heat resistance that withstands the heat treatment in the manufacturing process for a semiconductor package. With this, the adhesive layer is less liable to be melted in the manufacturing process for a semiconductor package, and the accuracy of the processing treatment can be enhanced.

It is preferred that the laminate of the present invention further comprise a peeling layer between the substrate to be processed and the glass sheet, more specifically, between the substrate to be processed and the adhesive layer, or further comprise a peeling layer between the glass sheet and the adhesive layer. With this, after the substrate to be processed is subjected to predetermined processing treatment, the substrate to be processed is easily peeled from the glass sheet. From the viewpoint of productivity, it is preferred that the substrate to be processed be peeled from the glass sheet through laser irradiation or the like.

The peeling layer is formed of a material in which "in-layer peeling" or "interfacial peeling" occurs through laser irradiation or the like. That is, the peeling layer is formed of a material in which the interatomic or intermolecular binding force between atoms or molecules is lost or reduced to cause ablation or the like, to thereby cause peeling, through irradiation with light having predetermined intensity. There are the case where components contained in the peeling layer turn into a gas to be released, to thereby cause separation, through irradiation with light, and the case where the peeling layer absorbs light to turn into a gas and the vapor thereof is released, to thereby cause separation.

In the laminate of the present invention, it is preferred that the glass sheet be larger than the substrate to be processed. With this, even when the center positions of the substrate to be processed and the glass sheet are slightly separated from each other at a time when the substrate to be processed and the glass sheet are supported, an edge portion of the substrate to be processed is less liable to extend off from the glass sheet.

A method of manufacturing a semiconductor package according to the present invention has a feature of comprising the steps of: preparing a laminate including at least a substrate to be processed and a glass sheet configured to support the substrate to be processed; and subjecting the substrate to be processed to processing treatment, the glass sheet comprising the above-mentioned glass sheet. Here, the technical features (preferred configuration and effects) of the method of manufacturing a semiconductor package according to the present invention overlap the technical features of the glass sheet and laminate of the present invention. Thus, the details of the overlapping portions are omitted in this description.

The method of manufacturing a semiconductor package according to the present invention comprises the step of preparing a laminate including at least a substrate to be processed and a glass sheet configured to support the substrate to be processed. The laminate including at least a substrate to be processed and a glass sheet configured to support the substrate to be processed has the above-mentioned material construction.

It is preferred that the method of manufacturing a semiconductor package according to the present invention further comprise the step of conveying the laminate. With this, the treatment efficiency of the processing treatment can be enhanced. The "step of conveying the laminate" and the "step of subjecting the substrate to be processed to processing treatment" are not required to be performed separately, and may be performed simultaneously.

In the method of manufacturing a semiconductor package according to the present invention, it is preferred that the processing treatment be treatment involving arranging wiring on one surface of the substrate to be processed or treatment involving forming solder bumps on one surface of the substrate to be processed. In the method of manufacturing a semiconductor package according to the present invention, during the treatment, the substrate to be processed is less liable to be changed in dimension, and hence those steps can be performed properly.

Besides the foregoing, the processing treatment may be any of treatment involving mechanically polishing one surface (in general, the surface on an opposite side to the glass sheet) of the substrate to be processed, treatment involving subjecting one surface (in general, the surface on an opposite side to the glass sheet) of the substrate to be processed to dry etching, and treatment involving subjecting one surface (in general, the surface on an opposite side to the glass sheet) of the substrate to be processed to wet etching. In the method of manufacturing a semiconductor package of the present invention, warpage is less liable to occur in the substrate to be processed, and the stiffness of the laminate can be maintained. As a result, the processing treatment can be performed properly.

The semiconductor package according to the present invention has a feature of being manufactured by the above-mentioned method of manufacturing a semiconductor package. Here, the technical features (preferred configuration and effects) of the semiconductor package of the present invention overlap the technical features of the glass sheet, laminate, and method of manufacturing a semiconductor package of the present invention. Thus, the details of the overlapping portions are omitted in this description.

The electronic device according to the present invention has a feature of comprising a semiconductor package, the semiconductor package comprising the above-mentioned semiconductor package. Here, the technical features (preferred configuration and effects) of the electronic device of the present invention overlap the technical features of the glass sheet, laminate, method of manufacturing a semiconductor package, and semiconductor package of the present invention. Thus, the details of the overlapping portions are omitted in this description.

The present invention is further described with reference to the drawings.

Figure 3:
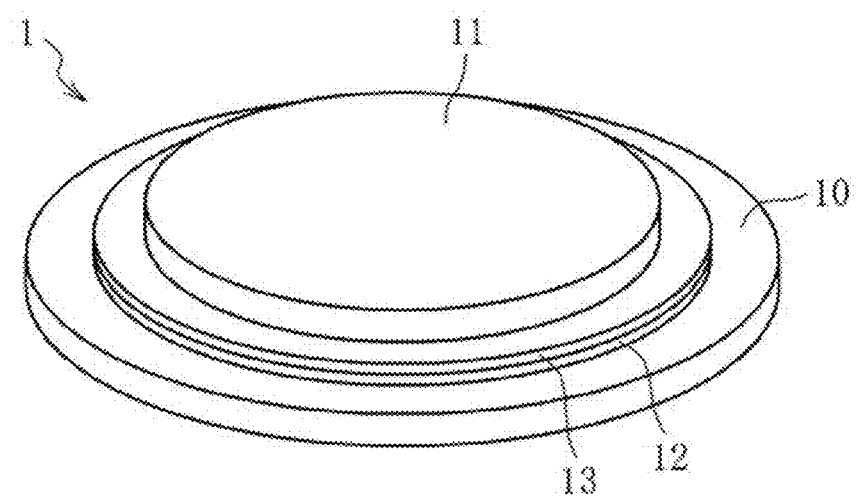
FIG. 3 is a conceptual perspective view for illustrating an example of a laminate of the present invention.

FIG. 3 is a conceptual perspective view for illustrating an example of a laminate 1 of the present invention. In FIG. 3, the laminate 1 comprises a glass sheet 10 and a substrate 11 to be processed. The glass sheet 10 is bonded onto the substrate 11 to be processed so as to prevent a dimensional change of the substrate 11 to be processed. A peeling layer 12 and an adhesive layer 13 are formed between the glass sheet 10 and the substrate 11 to be processed. The peeling layer 12 is held in contact with the glass sheet 10, and the adhesive layer 13 is held in contact with the substrate 11 to be processed.

As is understood from FIG. 3, the laminate 1 comprises the glass sheet 10, the peeling layer 12, the adhesive layer 13, and the substrate 11 to be processed, which are laminated in the stated order. The shape of the glass sheet 10 is determined depending on the substrate 11 to be processed, and in FIG. 3, both the glass sheet 10 and the substrate 11 to be processed have a substantially disc shape. In the peeling layer 12, silicon oxide, a silicate compound, silicon nitride, aluminum nitride, titanium nitride, or the like may be used besides amorphous silicon (a-Si). The peeling layer 12 is formed by plasma CVD, spin coating using a sol-gel method, or the like. The adhesive layer 13 is made of a resin and is formed through application, for example, by any of various printing methods, an ink jet method, a spin coating method, a roll coating method, or the like. The adhesive layer 13 is removed by being dissolved in a solvent or the like after the glass sheet 10 is peeled from the substrate 11 to be processed through use of the peeling layer 12.

Figure 4A:
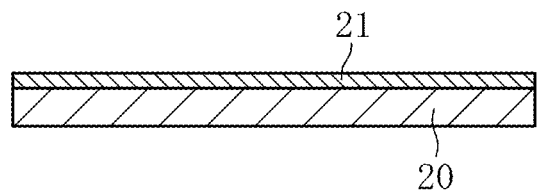
FIG. 4A is a conceptual sectional view for illustrating part of a manufacturing process for a fan-out type WLP.
Figure 4B:
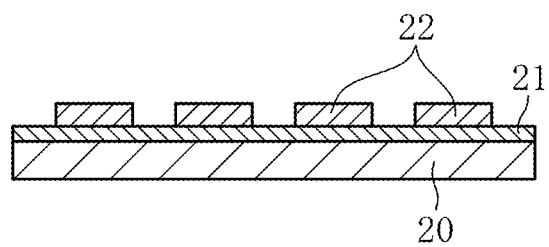
FIG. 4B is a conceptual sectional view for illustrating part of the manufacturing process for a fan-out type WLP.
Figure 4C:
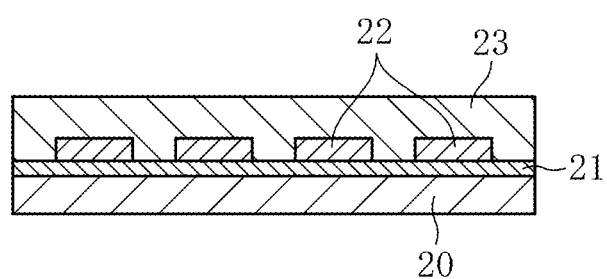
FIG. 4C is a conceptual sectional view for illustrating part of the manufacturing process for a fan-out type WLP.
Figure 4D:
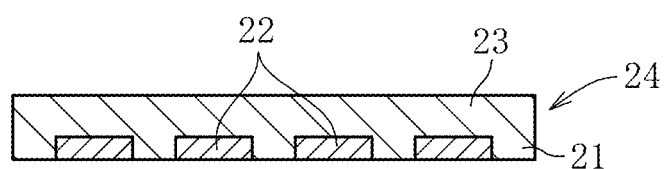
FIG. 4D is a conceptual sectional view for illustrating part of the manufacturing process for a fan-out type WLP.
Figure 4E:
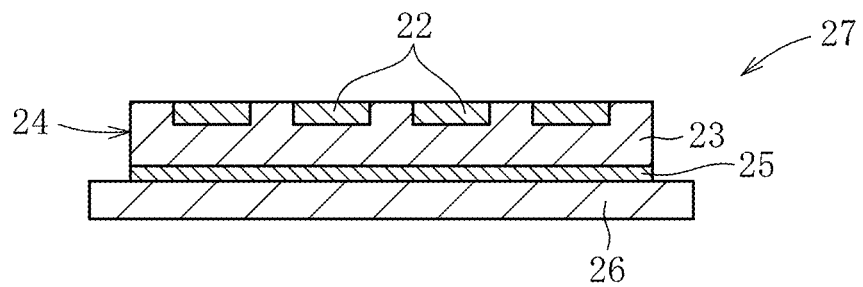
FIG. 4E is a conceptual sectional view for illustrating part of the manufacturing process for a fan-out type WLP.
Figure 4F:
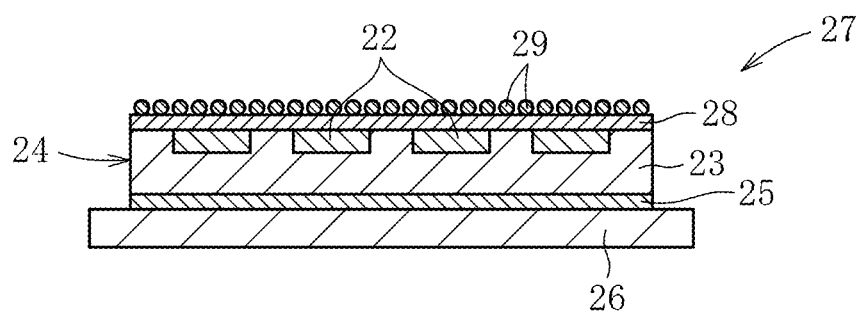
FIG. 4F is a conceptual sectional view for illustrating part of the manufacturing process for a fan-out type WLP.
Figure 4G:
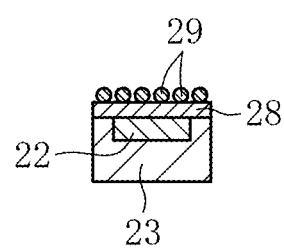
FIG. 4G is a conceptual sectional view for illustrating part of the manufacturing process for a fan-out type WLP.

FIG. 4A to FIG. 4G are conceptual sectional views for illustrating a manufacturing process for a fan-out type WLP. FIG. 4A is an illustration of a state in which an adhesive layer 21 is formed on one surface of a supporting member 20. As necessary, a peeling layer may be formed between the supporting member 20 and the adhesive layer 21. Next, as illustrated in FIG. 4B, a plurality of semiconductor chips 22 are bonded onto the adhesive layer 21. In this case, an active surface of each semiconductor chip 22 is brought into contact with the adhesive layer 21. Then, as illustrated in FIG. 4C, the semiconductor chips 22 are molded with a sealing material 23 of a resin. As the sealing material 23, a material having less change in dimension after compression molding and having less change in dimension during formation of wiring is used. Then, as illustrated in FIG. 4D and FIG. 4E, a substrate 24 to be processed having the semiconductor chips 22 molded therein is separated from the supporting member 20 and is adhesively fixed onto a glass sheet 26 through intermediation of an adhesive layer 25. In this case, in the surface of the substrate 24 to be processed, the surface on an opposite side to the surface in which the semiconductor chips 22 are buried is arranged on the glass sheet 26 side. Thus, a laminate 27 can be obtained. As necessary, a peeling layer may be formed between the adhesive layer 25 and the glass sheet 26. After the obtained laminate 27 is conveyed, as illustrated in FIG. 4F, a wiring 28 is formed on the surface of the substrate 24 to be processed in which the semiconductor chips 22 are buried, and then a plurality of solder bumps 29 are formed. Finally, as illustrated in FIG. 4G, after the substrate 24 to be processed is separated from the glass sheet 26, the substrate 24 to be processed is cut for each semiconductor chip 22 to be used in a later packaging step.

EXAMPLES

Example 1

Now, the present invention is described with reference to Examples. However, Examples below are merely examples, and the present invention is by no means limited to the following Examples.

Glass raw materials were blended so as to comprise as a glass composition, in terms of mass %, 65.2% of $SiO_2$, 8% of $Al_2O_3$, 10.5% of $B_2O_3$, 11.5% of $Na_2O$, 3.4% of CaO, 1% of ZnO, 0.3% of $SnO_2$, and 0.1% of $Sb_2O_3$. After that, the resultant was loaded into a glass melting furnace to be melted at from 1,500° C. to 1,600° C. Then, the molten glass was supplied into an overflow down-draw forming apparatus to be formed to a thickness of 0.7 mm.

Next, the obtained mother glass sheet was hollowed out into a wafer shape to provide a glass sheet. The entire end surface of the glass sheet was continuously irradiated with a $CO_2$ laser. Thus, the entire end surface of the glass sheet was melted to form a spherical expanding portion. Then, the resultant was solidified by cooling. Further, the glass sheet was annealed under the condition of a temperature of (softening point of the glass sheet+50° C.) for 90 minutes, to thereby remove the residual stress of the expanding portion. The wavelength of the $CO_2$ laser was 10.6 μm, and the laser output was adjusted to from 9 W to 18 W.

Subsequently, the surface of each glass sheet was subjected to polishing treatment with a polishing apparatus to remove the expanding portion of the glass sheet and to reduce the total thickness variation of the glass sheet. Specifically, both surfaces of the glass sheet were sandwiched between a pair of polishing pads having different outer diameters, and both the surfaces of the glass sheet were subjected to polishing treatment while the glass sheet and the pair of polishing pads were rotated together. Part of the glass sheet was caused to extend off from the polishing pads intermittently during the polishing treatment. The polishing pads were made of urethane. The average particle diameter of a polishing slurry used in the polishing treatment was 2.5 μm, and the polishing speed was 15 m/min. The obtained glass sheet (each of five samples) before and after the polishing treatment was measured for a maximum thickness (Maximum Thickness), a minimum thickness (Minimum Thickness), an average thickness (Average Thickness), and a total thickness variation (TTV) with SBW-331ML/d manufactured by Kobelco Research Institute, Inc. The measurement results (region excluding the expanding portion was measured) of the glass sheet before the polishing treatment are shown in Table 1, and the measurement results of the glass sheet after the polishing treatment are shown in Table 2.

TABLE 1

| | Maximum Thickness (μm) | Minimum Thickness (μm) | Average Thickness (μm) | TTV (μm) |
|---|---|---|---|---|
| No. 1 | 831.1 | 821.5 | 822.9 | 9.6 |
| No. 2 | 822.3 | 817 | 820 | 5.3 |
| No. 3 | 823 | 817.3 | 820.6 | 5.7 |
| No. 4 | 821.1 | 816.3 | 817.5 | 4.8 |
| No. 5 | 825.5 | 814.2 | 817.2 | 11.3 |

TABLE 2

| | Maximum Thickness (μm) | Minimum Thickness (μm) | Average Thickness (μm) | TTV (μm) |
|---|---|---|---|---|
| No. 1 | 804 | 803.2 | 803.8 | 0.8 |
| No. 2 | 803.7 | 803.1 | 803.5 | 0.6 |
| No. 3 | 803.7 | 803.1 | 803.4 | 0.6 |
| No. 4 | 799.8 | 799.2 | 799.5 | 0.6 |
| No. 5 | 799.7 | 799.1 | 799.4 | 0.6 |

As is understood from Tables 1 and 2, the total thickness variation of the glass sheet was reduced to 0.8 μm or less.

Further, the glass sheets (ten samples) after the polishing treatment and the glass sheets (ten samples) before the $CO_2$ laser irradiation were subjected to a four-point bending test through use of a precision universal testing instrument Autograph AG-IS manufactured by Shimadzu Corporation. The results are shown in Table 3. The condition of the four-point bending test was set to a pressure jig width of 25 mm, a support jig width of 50 mm, and a crosshead lowering speed of 5 mm/min.

TABLE 3

| | End surface Melt-solidified surface (MPa) | End surface Broken surface (MPa) |
|---|---|---|
| Sample 1 | 312 | 148 |
| Sample 2 | 503 | 168 |
| Sample 3 | 475 | 178 |

TABLE 3-continued

| | End surface Melt-solidified surface (MPa) | End surface Broken surface (MPa) |
|---|---|---|
| Sample 4 | 578 | 175 |
| Sample 5 | 592 | 175 |
| Sample 6 | 535 | 170 |
| Sample 7 | 411 | 153 |
| Sample 8 | 537 | 172 |
| Sample 9 | 543 | 171 |
| Sample 10 | 456 | 167 |
| MAX | 592 | 178 |
| MIN | 312 | 148 |
| AVE | 494 | 168 |

As is apparent from Table 3, the end surface strength was significantly increased by forming the melt-solidified surface on the end surface of the glass sheet.

Example 2

First, glass raw materials were blended so as to have a glass composition of each of Sample Nos. 1 to 7 shown in Table 4. After that, the resultant was loaded into a glass melting furnace to be melted at from 1,500° C. to 1,600° C. Then, the molten glass was supplied into an overflow down-draw forming apparatus to be formed to a thickness of 0.8 mm. After that, the mother glass sheet was hollowed out into a wafer shape to form a melt-solidified surface on the entire end surface of the obtained glass sheet under the same condition as that of [Example 1], and further subjected to annealing treatment. Each of the obtained glass sheets was evaluated for an average thermal expansion coefficient $\alpha_{30\text{-}380}$ within a temperature range of from 30° C. to 380° C., a density ρ, a strain point Ps, an annealing point Ta, a softening point Ts, a temperature at a viscosity at high temperature of $10^{4.0}$ dPa·s, a temperature at a viscosity at high temperature of $10^{3.0}$ dPa·s, a temperature at a viscosity at high temperature of $10^{2.5}$ dPa·s, a temperature at a viscosity at high temperature of $10^{2.0}$ dPa·s, a liquidus temperature TL, and a Young's modulus E. After the cutting, each of the glass sheets to be melt-solidified was measured for a total thickness variation and a warpage level with SBW-331ML/d manufactured by Kobelco Research Institute, Inc. As a result, each total thickness variation was 3 μm, and each warpage level was 70 μm.

TABLE 4

| | | No. 1 | No. 2 | No. 3 | No. 4 | No. 5 | No. 6 | No. 7 |
|---|---|---|---|---|---|---|---|---|
| Component (wt %) | $SiO_2$ | 65.0 | 63.2 | 65.3 | 64.0 | 60.0 | 58.4 | 61.4 |
| | $Al_2O_3$ | 8.2 | 8.0 | 8.0 | 8.0 | 16.7 | 13.0 | 18.0 |
| | $B_2O_3$ | 13.5 | 13.1 | 8.6 | 13.3 | 9.8 | 0.0 | 0.5 |
| | MgO | 0.0 | 0.0 | 0.0 | 0.0 | 0.8 | 2.0 | 3.0 |
| | CaO | 3.3 | 3.2 | 3.2 | 3.2 | 8.0 | 2.0 | 0.0 |
| | SrO | 0.0 | 0.0 | 0.0 | 0.0 | 4.5 | 0.0 | 0.0 |
| | ZnO | 0.9 | 0.9 | 0.9 | 1.0 | 0.0 | 0.0 | 0.0 |
| | $Na_2O$ | 8.7 | 11.3 | 13.6 | 10.1 | 0.0 | 14.5 | 14.5 |
| | $K_2O$ | 0.0 | 0.0 | 0.0 | 0.0 | 0.0 | 5.5 | 2.0 |
| | $ZrO_2$ | 0.0 | 0.0 | 0.0 | 0.0 | 0.0 | 4.5 | 0.0 |
| | $Sb_2O_3$ | 0.1 | 0.0 | 0.1 | 0.1 | 0.0 | 0.0 | 0.0 |
| | $SnO_2$ | 0.3 | 0.3 | 0.3 | 0.3 | 0.2 | 0.0 | 0.7 |
| $\alpha_{30\text{-}380}$ (×$10^{-7}$/° C.) | | 59 | 68 | 77 | 64 | 38 | 102 | 91 |
| ρ (g/cm$^3$) | | 2.39 | 2.43 | 2.47 | 2.41 | 2.46 | 2.54 | 2.45 |
| Ps (° C.) | | 535 | 530 | 530 | 530 | 673 | 533 | 564 |
| Ta (° C.) | | 570 | 565 | 565 | 565 | 725 | 576 | 613 |
| Ts (° C.) | | 755 | 730 | 735 | 740 | 943 | 793 | 863 |
| $10^{4.0}$ dPa · s (° C.) | | 1,095 | 1,050 | 1,045 | 1,065 | 1,256 | 1,142 | 1,255 |
| $10^{3.0}$ dPa · s (° C.) | | 1,305 | 1,240 | 1,240 | 1,265 | Unmeasured | 1,319 | 1,460 |
| $10^{2.5}$ dPa · s (° C.) | | 1,450 | 1,385 | 1,380 | 1,410 | 1,519 | 1,431 | 1,591 |
| $10^{2.0}$ dPa · s (° C.) | | 1,640 | 1,570 | 1,540 | 1,595 | Unmeasured | Unmeasured | Unmeasured |
| TL (° C.) | | 890 | 802 | 800 | 850 | Unmeasured | 880 | 970 |
| E (GPa) | | 71 | 74 | 75 | 75 | 75 | 75 | 71 |

The average thermal expansion coefficient $\alpha_{30-380}$ within a temperature range of from 30° C. to 380° C. is a value measured with a dilatometer.

The density $\rho$ is a value measured by a well-known Archimedes method.

The strain point Ps, the annealing point Ta, and the softening point Ts are values obtained by measurement based on the method of ASTM C336.

The temperatures at viscosities at high temperature of $10^{4.0}$ dPa·s, $10^{3.0}$ dPa·s, and $10^{2.5}$ dPa·s are values obtained by measurement by a platinum sphere pull up method.

The liquidus temperature TL is a value obtained by loading glass powder that has passed through a standard 30-mesh sieve (500 μm) and remained on a 50-mesh sieve (300 μm) into a platinum boat, keeping the glass powder for 24 hours in a gradient heating furnace, and then measuring, by a microscopic observation, a temperature at which crystals of glass are deposited.

The Young's modulus E is a value measured by a resonance method.

Then, the surface of the glass sheet was subjected to polishing treatment with a polishing apparatus. Specifically, both surfaces of the glass sheet were sandwiched between a pair of polishing pads having different outer diameters, and both the surfaces of the glass sheet were subjected to polishing treatment while the glass sheet and the pair of polishing pads were rotated together. Part of the glass sheet was caused to extend off from the polishing pads intermittently during the polishing treatment. The polishing pads were made of urethane. The average particle diameter of a polishing slurry used in the polishing treatment was 2.5 μm, and the polishing speed was 15 m/min. Each of the obtained polished glass sheets was measured for a total thickness variation and a warpage level with SBW-331ML/d manufactured by Kobelco Research Institute, Inc. As a result, each total thickness variation was 0.45 μm, and each warpage level was 35 μm.

REFERENCE SIGNS LIST 1, 27 laminate
10, 26 glass sheet
11, 24 substrate to be processed
12 peeling layer
13, 21, 25 adhesive layer
20 supporting member
22 semiconductor chip
23 sealing material
28 wiring
29 solder bump

The invention claimed is:

1. A method of manufacturing a glass sheet having a first surface and a second surface opposite to the first surface, the method comprising the steps of:
   (1) cutting a mother glass sheet having a thickness of 0.4 mm or more and less than 2.0 mm to provide a glass sheet;
   (2) melting part or all of an end surface of the glass sheet after the cutting by laser irradiation to form a spherical expanding portion at the end surface, followed by solidifying the part or the all of the end surface; and
   (3) polishing the first surface and the second surface of the glass sheet so that the glass sheet has a total thickness variation of less than 2.0 μm and removing a protruding portion of the spherical expanding portion that protrudes from the first surface and the second surface by the polishing.

2. The method of manufacturing a glass sheet according to claim 1, further comprising forming the mother glass sheet by an overflow down-draw method.

3. The method according to claim 1, wherein the glass sheet has a total thickness variation of less than 1.0 μm.

4. The method according to claim 1, wherein the glass sheet has a warpage level of 60 μm or less.

5. The method according to claim 1, wherein the glass sheet has a Young's modulus of 65 GPa or more.

6. The method according to claim 1, wherein the glass sheet has a contour of a wafer shape.

* * * * *